(12) United States Patent
Lin et al.

(10) Patent No.: US 8,362,568 B2
(45) Date of Patent: Jan. 29, 2013

(54) RECESSED CONTACT FOR MULTI-GATE FET OPTIMIZING SERIES RESISTANCE

(75) Inventors: Chung-Hsun Lin, Yorktown Heights, NY (US); Josephine B. Chang, Yorktown Heights, NY (US)

(73) Assignee: International Business Machines Corporation, Armonk, NY (US)

(*) Notice: Subject to any disclaimer, the term of this patent is extended or adjusted under 35 U.S.C. 154(b) by 629 days.

(21) Appl. No.: 12/583,933

(22) Filed: Aug. 28, 2009

(65) Prior Publication Data

US 2011/0049583 A1    Mar. 3, 2011

(51) Int. Cl.
*H01L 29/94*    (2006.01)
(52) U.S. Cl. .. 257/368; 257/288; 257/384; 257/E21.049
(58) Field of Classification Search .......... 257/384, 257/368, 386, 288, E21.409
See application file for complete search history.

(56) References Cited

U.S. PATENT DOCUMENTS

| | | | |
|---|---|---|---|
| 6,252,284 B1 | 6/2001 | Muller et al. | 257/412 |
| 6,921,982 B2 | 7/2005 | Joshi et al. | 257/903 |
| 2003/0052347 A1 | 3/2003 | Fung | 257/288 |
| 2005/0156236 A1 | 7/2005 | Nandakumar et al. | 257/344 |
| 2006/0192268 A1 | 8/2006 | Benaissa et al. | 257/595 |
| 2006/0220131 A1 | 10/2006 | Kinoshita et al. | 257/347 |
| 2007/0111435 A1 | 5/2007 | Kim et al. | 438/253 |
| 2007/0145487 A1 | 6/2007 | Kavalieros et al. | 257/368 |
| 2008/0173953 A1* | 7/2008 | Anderson et al. | 257/384 |
| 2008/0265321 A1 | 10/2008 | Yu et al. | 257/344 |
| 2009/0098980 A1 | 4/2009 | Waters | 482/8 |
| 2009/0321841 A1 | 12/2009 | Hoentschel et al. | 257/369 |
| 2010/0133614 A1 | 6/2010 | Beyer et al. | 257/347 |

FOREIGN PATENT DOCUMENTS

EP    0 275 905 A2    7/1988

OTHER PUBLICATIONS

Wu, Xusheng et al., "Impacts of Nonrectangular Fin Cross Section on the Electrical Characteristics of FinFET", IEEE 2005, pp. 63-68.
Chan, Mansun et al., "Recessed-Channel Structure for Fabricating Ultrathin SOI MOSFET with Low Series Resistance", IEEE, Jan. 1994, pp. 22-24.
Chau, Robert et al., "Silicon Nano-Transistors and Breaking the 10nm Physical Gate Length Barrier", pp. 123-126.
Wang, YangYuan, et al., "Novel devices and process for 32 nm CMOS technology and beyond", Science in China Series F: Information Sciences, vol. 51, No. 6, Jun. 2008, pp. 743-755.

* cited by examiner

*Primary Examiner* — Samuel Gebremariam
(74) *Attorney, Agent, or Firm* — Harrington & Smith; Louis J. Percello

(57) ABSTRACT

A transistor, which can be referred to as a multi-gate transistor or as a FinFET, includes a gate structure having a length, a width and a height. The transistor further includes at least one electrically conductive channel or fin between a source region and a drain region that passes through the width of the gate structure. The channel has a first height ($h_1$) within the gate structure that is less than the height of the gate structure, and has a second height ($h_2$) external to the gate structure, where $h_2$ is less than $h_1$. The transistor further includes a silicide layer disposed at least partially over the at least one channel external to the gate structure. Reducing the fin height external to the gate structure is shown to beneficially reduce parasitic resistance.

8 Claims, 6 Drawing Sheets

RECESSED CONTACT FOR MULTI-GATE FET OPTIMIZING SERIES RESISTANCE

TECHNICAL FIELD

The exemplary embodiments of this invention relate generally to field effect transistors (FETs) and, more specifically, relate to FET contact structures.

BACKGROUND

Semiconductors and integrated circuit chips have become ubiquitous within many products due to their continually decreasing cost and size. Miniaturization in general allows increased performance (more processing per clock cycle and less heat generated) at lower power levels and lower cost. Present technology is at or approaching atomic level scaling of certain micro-devices such as logic gates, FETs, capacitors, etc. Circuit chips with hundreds of millions of such devices are not uncommon. Further size reductions appear to be approaching the physical limit of trace lines and micro-devices that are embedded upon and within their semiconductor substrates. The present invention is directed to such micro-sized FET devices.

Basically a FET is a transistor having a source, a gate, and a drain. The action of the FET depends on the flow of majority carriers along a channel between the source and drain that runs past the gate. Current through the channel, which is between the source and drain, is controlled by the transverse electric field under the gate. More than one gate (multi-gate) can be used to more effectively control the channel. The length of the gate determines how fast the FET switches, and can be about the same as the length of the channel (i.e., the distance between the source and drain). Multi-gate FETs are considered to be promising candidates to scale CMOS FET technology down to the sub-22 nm regime. However, such small dimensions necessitate greater control over performance issues such as short channel effects, punch-through, metal-oxide semiconductor (MOS) leakage current and, of particular relevance herein, the parasitic resistance that is present in a multi-gate FET.

The size of FETs has been successfully reduced through the use of one or more fin-shaped channels. A FET employing such a channel structure can be referred to as a FinFET. Previously, complementary metal-oxide semiconductor (CMOS) devices were substantially planar along the surface of the semiconductor substrate, the exception being the FET gate that was disposed over the top of the channel. Fins break from this paradigm by using a vertical channel structure in order to maximize the surface area of the channel that is exposed to the gate. The gate controls the channel more strongly because it extends over more than one side (surface) of the channel. For example, the gate can enclose three surfaces of the three-dimensional channel, rather than being disposed only across the top surface of the traditional planar channel.

One challenge in fabricating multi-gate FETs is the high parasitic resistance due to the ultra-thin body channel, which can significantly degrade the drive current. The parasitic resistance is believed to be due mainly to sheet resistance under a spacer layer, and contact resistance in the source and drain (S/D) regions.

What is needed is a technique to reduce the parasitic resistance in a FET device such as a multi-gate FET device.

SUMMARY

The foregoing and other problems are overcome, and other advantages are realized, in accordance with the exemplary embodiments of this invention.

In one aspect the exemplary embodiments of this invention provide a transistor that comprises a gate structure having a length, width and a height. The transistor further comprises at least one electrically conductive channel between a source region and a drain region that passes through the width of the gate structure. The channel has a first height ($h_1$) within the gate structure that is less than the height of the gate structure, and has a second height ($h_2$) external to the gate structure, where $h_2$ is less than $h_1$. The transistor further comprises a silicide layer disposed at least partially over the at least one channel external to the gate structure.

In another aspect the exemplary embodiments of this invention provide a method to fabricate a transistor that comprises forming at least one electrically conductive channel structure over a substrate, the channel having a length, a width and a first height ($h_1$); forming a gate structure over the substrate, the gate structure having a length, a width and a height, the gate structure being perpendicular to the channel structure and being formed over the channel structure such that the channel structure passes through the width of the gate structure, where the height of the gate structure is greater than $h_1$; reducing the height of the channel structure external to the gate structure so as to have a second height ($h_2$); and depositing a silicide layer at least partially over the at least one channel structure external to the gate structure.

In a further aspect the exemplary embodiments of this invention provide a method to reduce parasitic contact resistance in a multi-gate field effect transistor, comprising fabricating a plurality of fins between a source region and a drain region; fabricating a gate structure such that the plurality of fins pass through the gate structure; reducing a height of the fins external to the gate structure to produce a plurality of reduced height fins; and depositing a silicide layer at least partially over the plurality of reduced height fins.

DETAILED DESCRIPTION

It is noted that one possible approach to reduce the parasitic resistance can be to use highly angled implants to the extension region in conjunction with the selective epitaxial regrowth of the S/D region. However, the simultaneous vertical epitaxial re-growth of the S/D regions limits the improvement of the series resistance.

The exemplary embodiments of this invention are described below in the context of a FinFET. FIGS. 1A-1G provide an overview of one exemplary technique to fabricate a FinFET. FIGS. 2A, 2B, 3A and 3B illustrate a technique to modify the fabrication procedure to provide a FinFET having a reduced parasitic contact resistance in accordance with the exemplary embodiments of this invention.

FIGS. 1A-1G are presented in the context of side wall image transfer (SIT) fabrication technique that uses a spacer as a hard mask to define the fin. However, this is but one suitable FinFET fabrication technique, and should not be construed in a limiting sense upon the use and practice of this invention. In general, the exemplary embodiments of this invention can be used with or without a hard mask.

Figure 1A:
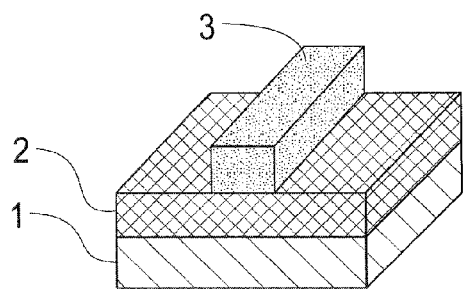
FIGS. 1A-1G, collectively referred to as FIG. 1, illustrate an overview of one exemplary procedure (side wall image transfer) to fabricate a FinFET.
Figure 1D:
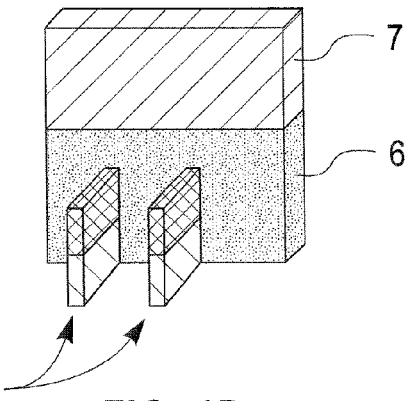
Figure 1B:
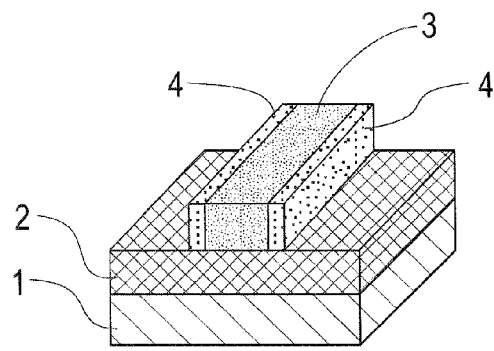
Figure 1E:
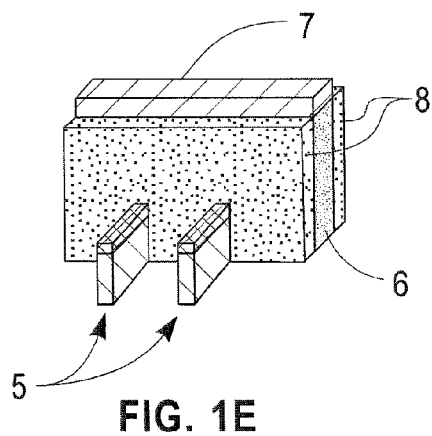
Figure 1C:
Figure 1F:
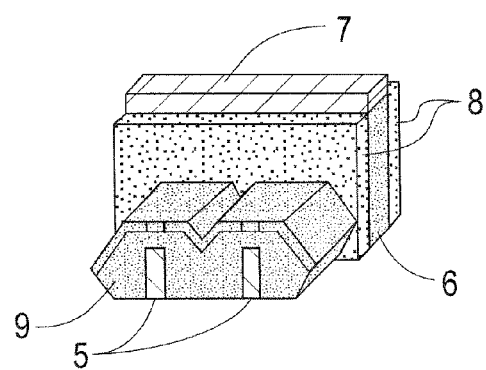
Figure 1G:
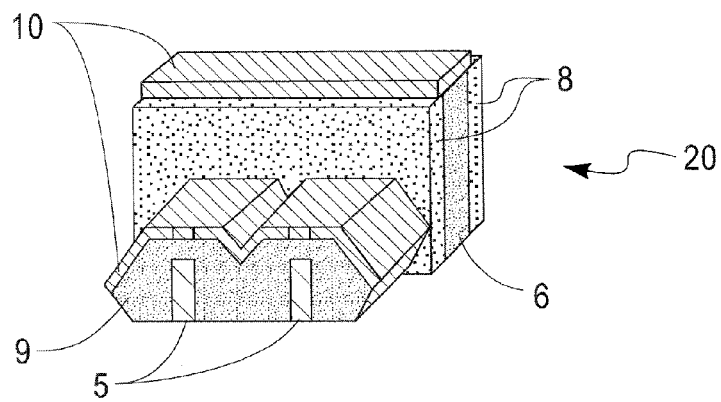

FIG. 1A shows the definition of polysilicon (Poly Si) mandrel 3 on a $SiO_2$ layer 2 formed on a silicon-on-insulator (SOI) layer 1 (the underlying buried oxide (BOX) and substrate of the SOI wafer are not shown). FIG. 1B shows a result of SIT pitch doubling, where sidewalls of the mandrel 3 have SiN layers 4 formed thereon. FIG. 1C shows a result of an etching operation and mandrel removal, and the resultant fins 5 (the underlying BOX (buried) and substrate of the SOI wafer are not shown). Each fin 5 is a multi-layered structure composed of a Si lower layer (which forms the channel of the completed FinFET), a $SiO_2$ middle layer and a SiN upper layer (which is removed prior to performing the operations shown in FIG. 1D). FIG. 1D depicts a result of gate stack deposition and planarization, hard mask deposition, gate lithography and a reactive ion etch (RIE). The resulting gate stack includes a poly Si gate 6 and an overlying layer of SiN 7. FIG. 1E shows a result of SiN offset spacer 8 formation followed by an extension implant. FIG. 1F shows a result of epitaxial Silicon (epi Si) growth, which provides a layer 9 of epi Si that covers the fins 5. Finally, FIG. 1G shows a result of offset spacer removal and final spacer formation followed by S/D implant and a rapid thermal anneal (RTA). The resulting FinFET device 20 includes a layer 10 of silicide over the top of the gate poly Si 8 and over the fin epi Si. In general, the FIGS. 1D-1G show the exposed fins 5 of FIG. 1C being transformed to a S/D. In general, the silicide layer 10 can have a thickness in a range of about 5 nm to about 30 nm (or thicker). In some embodiments the silicide layer 10 can have a nominal thickness of about 10 nm. The silicide layer 10 can be comprised of any suitable silicide, such as cobalt silicide ($CoSi_2$), nickel silicide (NiSi), or platinum silicide (PtSi, $Pt_2Si$), as non-limiting examples.

Figure 2A:
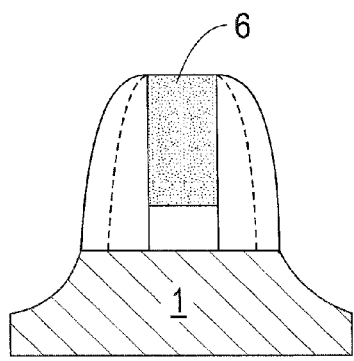
FIGS. 2A, 2B, 3A and 3B illustrate a technique to modify the fabrication procedure of FIG. 1 to provide a FinFET having a reduced parasitic contact resistance.
Figure 3A:
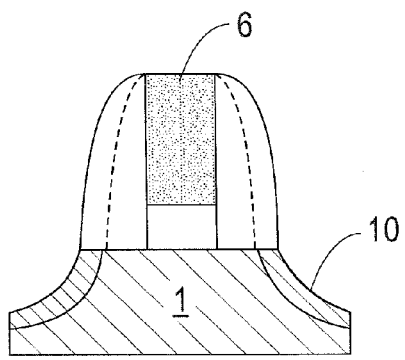

FIGS. 2A, 2B, 3A and 3B show a modification to the fabrication procedure shown in FIGS. 1A-1G so as to provide a recessed S/D structure and an optimized silicide contact profile, in accordance with the exemplary embodiments of this invention. Note that FIGS. 2A and 3A are cross-sectional views of the structures shown in FIGS. 2B and 3B, respectively, looking into the structure along the axis labeled A, with the cross-section taken generally through the center of the fin (designated B).

Figure 2B:
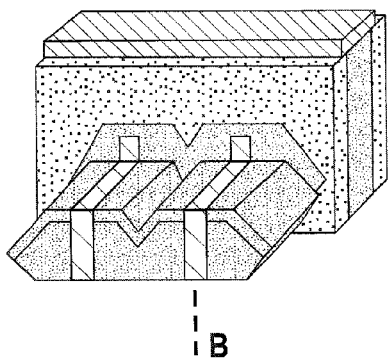
Figure 3B:
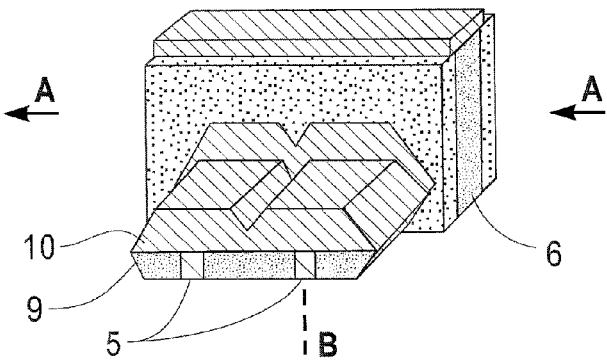

FIGS. 2A and 2B show a result of an additional processing step made after the step depicted in FIG. 1F, where the height of the fins 5 extending outwardly from the gate stack structure are reduced by some predetermined amount, such as by about 50%. The result of reducing the fin height can be referred to as creating recessed S/D contacts or regions. In addition, in these Figures the gate is assumed to fully encapsulated with $SiO_2$ on top of the fins. FIGS. 3A and 3B show the result of the silicide deposition and a resulting optimized silicide contact profile.

The exemplary embodiments of this invention thus provide a recessed S/D contact scheme that beneficially reduces the parasitic resistance in a multi-gate FET. The recessed S/D contact scheme can reduce the parasitic resistance by about 20% as compared to multi-gate FETs with a conventional merged fin structure (such as that shown in FIG. 1G). A merged fin implies the presence of multiple fins in parallel that share the same gate, source and drain, where the fins are combined (merged) at the S/D region in order to lower the resistance. Beneficially, the recessed S/D contact scheme is self-aligned to the heavily doped S/D region without the requirement of providing additional masks. The recessed S/D contact scheme is sufficiently robust to maintain a low value of parasitic resistance while the silicide coating penetrates into the unmerged fin region, and furthermore reduces the parasitic capacitance penalty typically associated with vertical epi Si growth in the merged S/D structure.

In these embodiments the original fin dimensions (both height and width) are preserved within the gate structure itself, while external to the gate structure the fin height is reduced by some predetermined amount, such as by about 50%.

Figure 4:
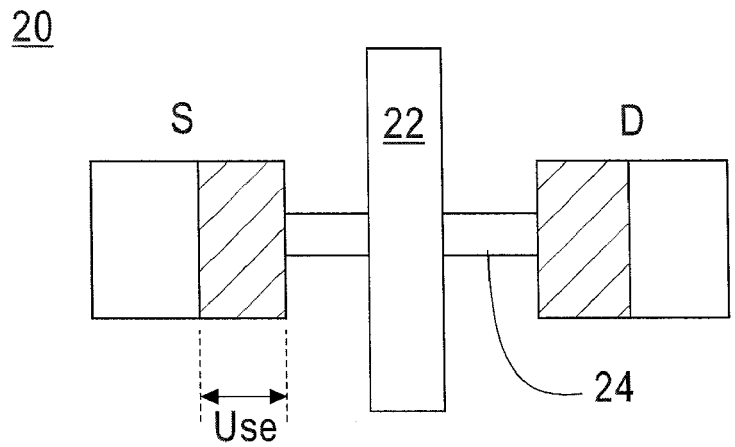
FIG. 4 shows a top view of a silicide block that is generally applicable to the embodiments shown in FIG. 5.

It should be noted that the particular recessed contact profile shown in FIG. 3A is but one example. Reference is now made to FIGS. 5A-5H for showing eight additional exemplary recessed contact schemes for merged fins. Reference is made first to FIG. 4, which shows a top view of a silicide block that is generally applicable to all of the embodiments shown in FIGS. 5A-5H. More generally, FIG. 4 shows the FinFET 20 with a gate structure 22 and a fin or channel structure 24 between S/D regions. FIG. 4 also shows an un-silicided epitaxial silicon (un-silicided epi or more simply USE) region.

Figure 5A:
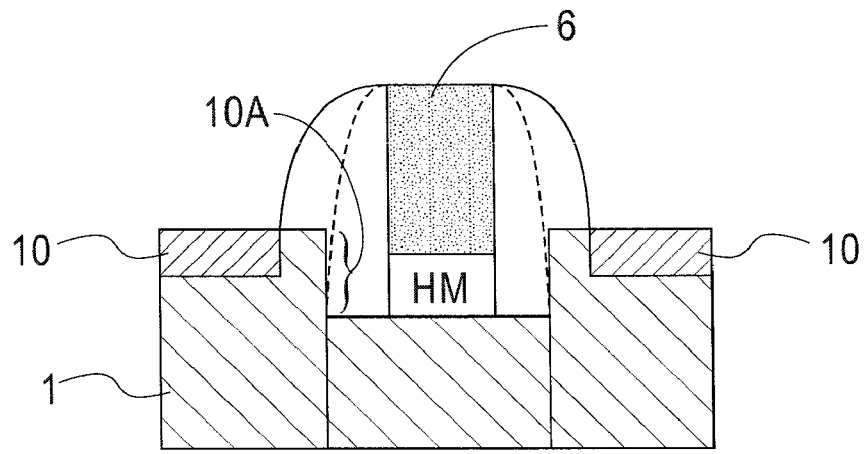
FIGS. 5A-5H, collectively referred to as FIG. 5, show eight exemplary recessed contact schemes for merged fins.
Figure 5B:
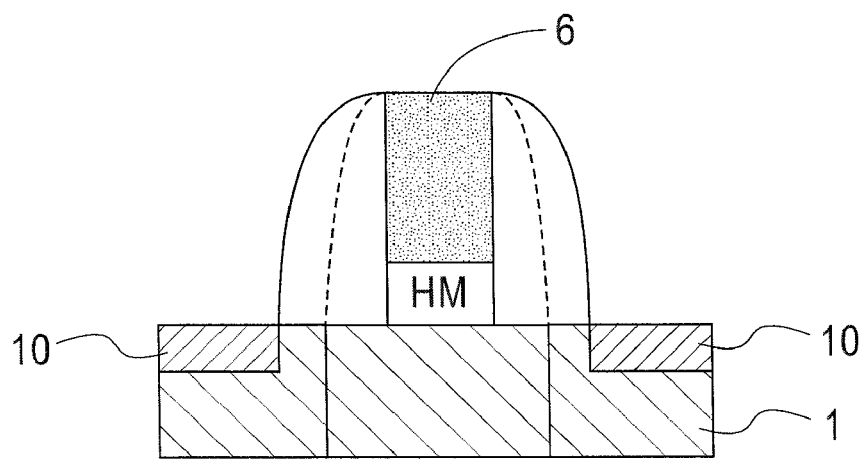
Figure 5C:
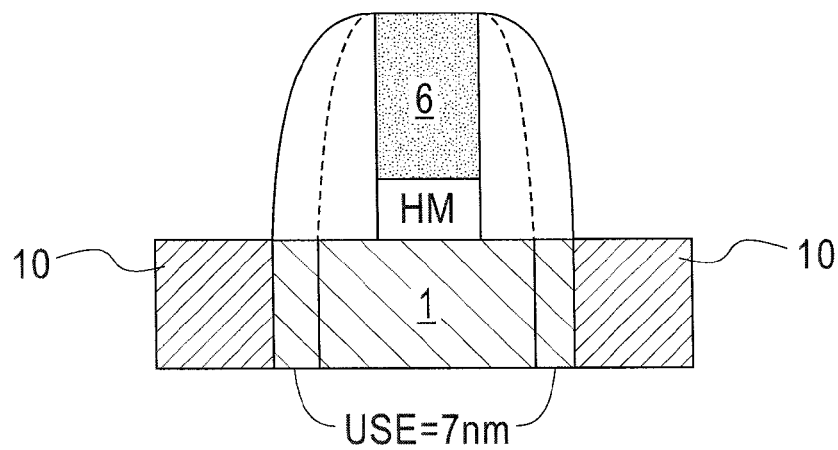
Figure 5D:
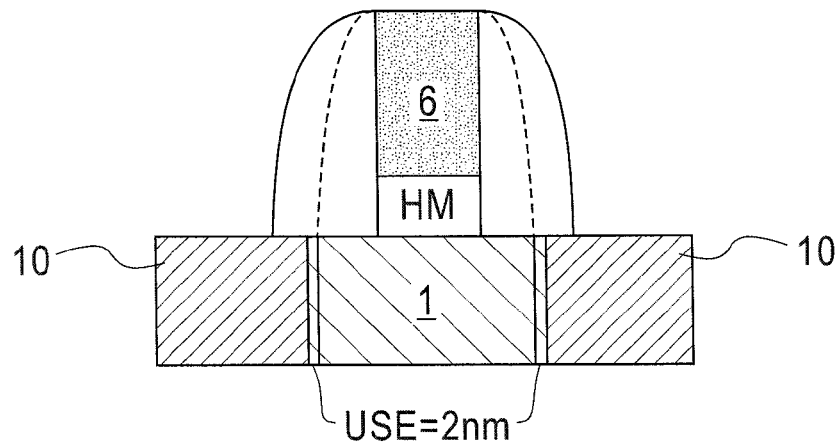
Figure 5E:
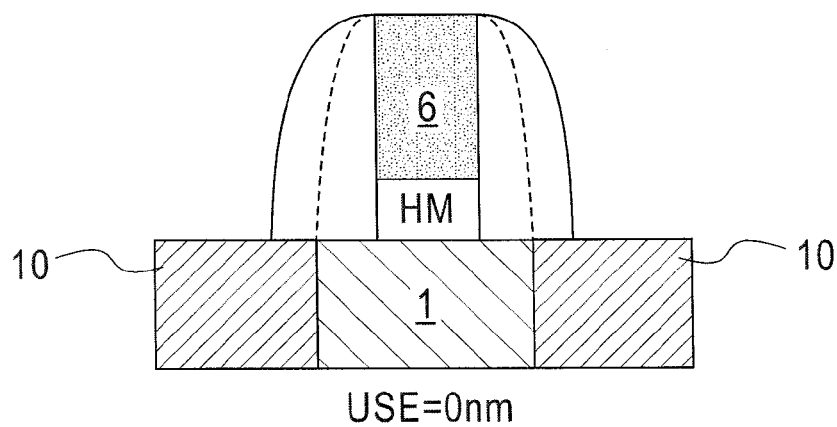
Figure 5F:
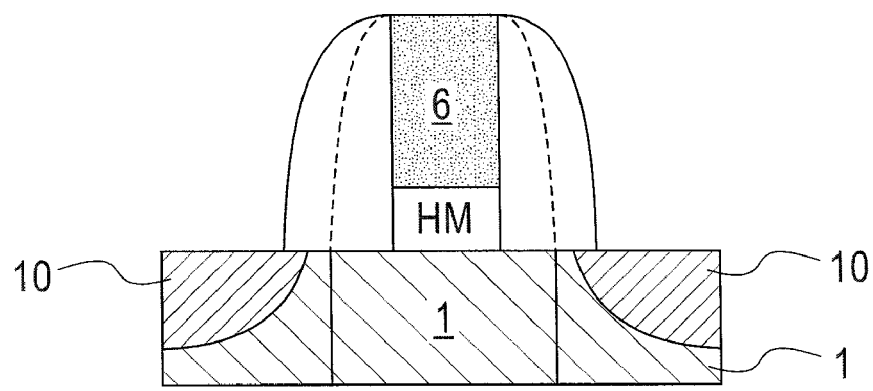
Figure 5G:
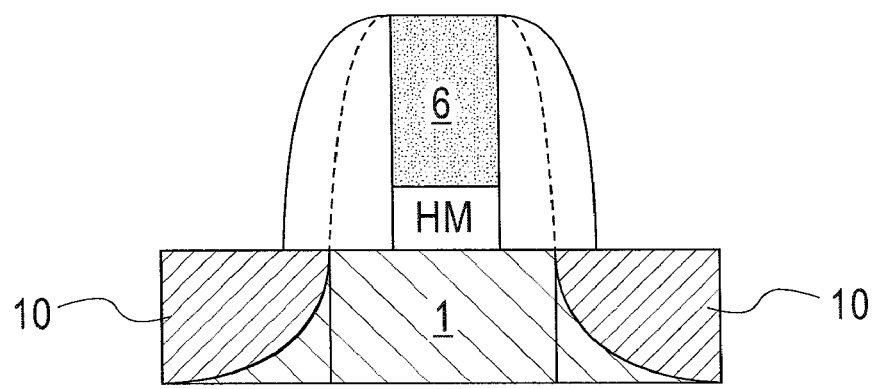
Figure 5H:
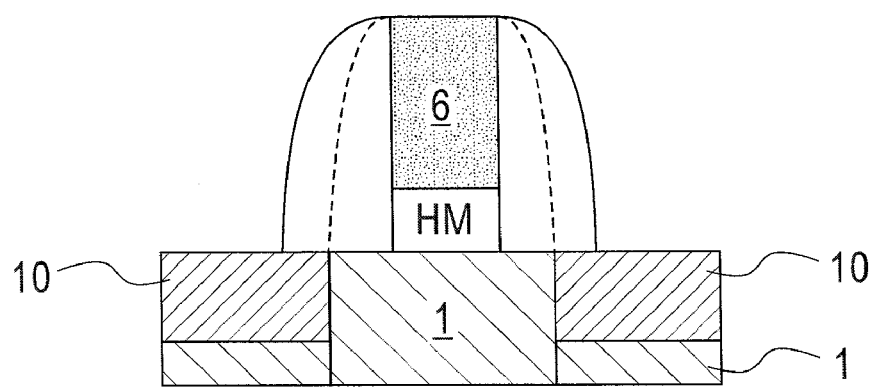
Figure 6:
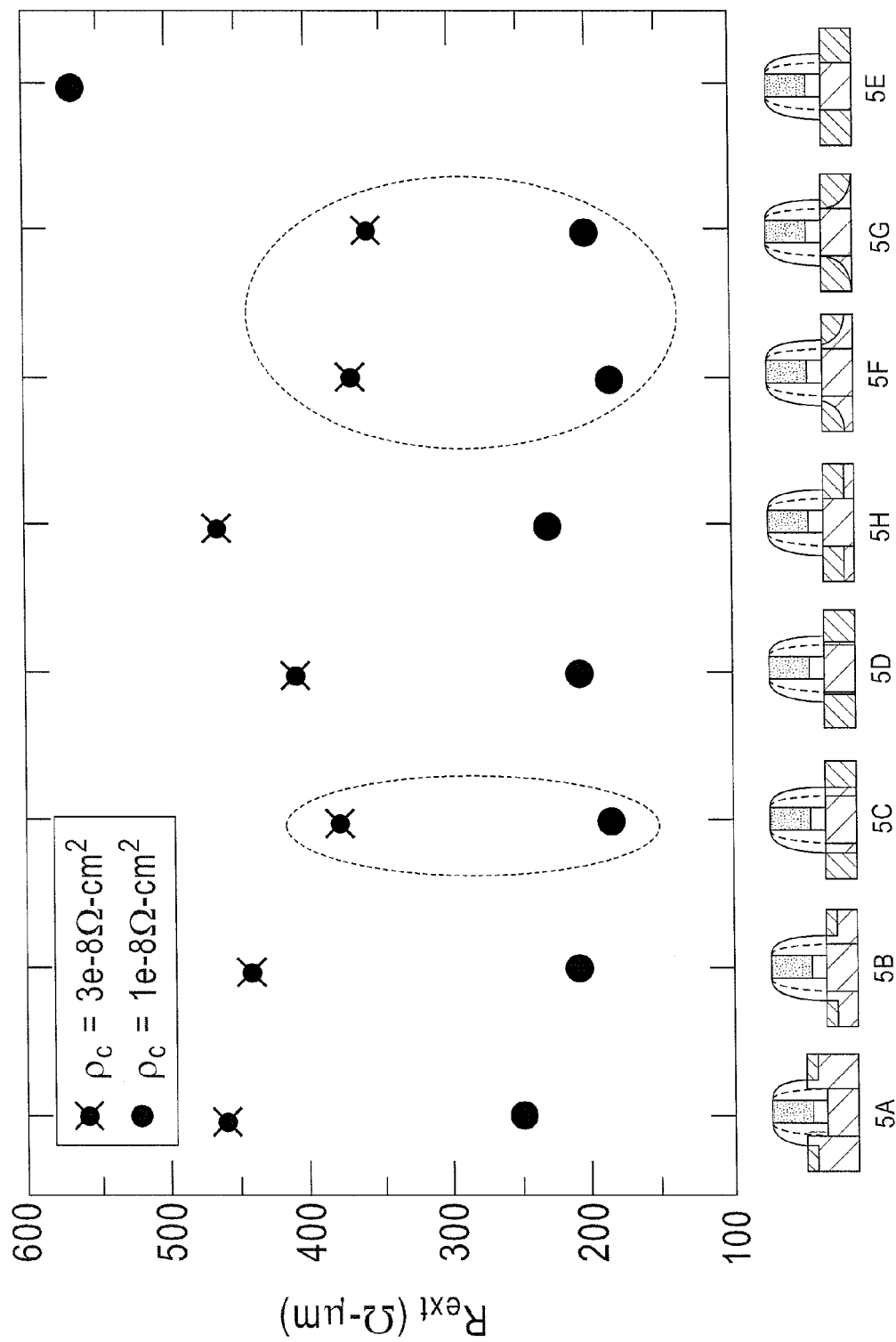
FIG. 6 shows resistivity $R_{ext}(\Omega\text{-cm}^2)$ for different contact schemes shown in FIGS. 5A-5H

In FIGS. 5A-5H the PC pitch (the pitch between two parallel gates) can be 80 nm, the fin pitch can be 40 nm, Lg (gate length) can be 20 nm, Dfin (fin width) can be 8 nm, Hfin (fin height) can be 30 nm, SP1 can be 8 nm and the final SP (spacer) can be 15 nm, the Gaussian profile for the S/D extension can be $2^{20}$ to $1^{19}$ (for 6 nm), and ρc (contact resistivity) can be $10^{-8}$, $3 \times 10^{-8}$ $\Omega$-$cm^2$ (see also FIG. 6). In all of the embodiments of FIGS. 5A-5H the gate Si 6 is assumed to overlie a hard mask (HM).

FIG. 5A shows an embodiment where epiV (thickness of the epi Si layer 10A) is 20 nm and $T_{silicide}$ (thickness of the silicide layer 10) is 10 nm. FIG. 5B shows an embodiment where epiV is 0 nm and $T_{silicide}$ is 10 nm. This embodiment can employ a RIE step after the fin is merged. FIGS. 5C, 5D and 5E show the USE thickness as 7 nm, 2 nm and 0 nm, respectively. FIG. 5F shows a case of USE=2 nm and a rounded boundary, with 10 nm of Si 1 (at the edge) beneath the silicide layer 10. FIG. 5G shows a case of USE=0 nm and the rounded boundary, with no Si 1 (edge) beneath the silicide layer 10. Finally, FIG. 5H shows a case of USE=0 nm and 15 nm of Si left beneath the silicide layer 10.

FIG. 6 shows the resistivity $R_{ext}$($\Omega$-$cm^2$) for the different contact schemes shown in FIGS. 5A-5H, where FIG. 6 plots $R_{ext}$ for two values of ρc ($10^{-8}$ and $3 \times 10^{-8}$ $\Omega$-$cm^2$). Note in reference to FIG. 6 that the embodiment of FIG. 5C (USE thickness equal to 7 nm), and the two rounded contour embodiments of FIGS. 5F and 5G, yield particularly low values of $R_{ext}$ as compared to the other embodiments.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

In general, the FinFET 20 in accordance with the exemplary embodiments of this invention can be implemented as an N-type device or a P-type device, and can have a doped or an undoped or a substantially undoped channel 24. The gate structure 22 can be fabricated using poly Si or metal, any suitable gate dielectric material can be used, and the silicide layer 10 can be composed of any suitable type of silicide. The FinFET 20 can be constructed to have single fin or channel structure 24 passing through the width of the gate structure 22, or there can be two or more fins or channel structures 24 passing through the width of the gate structure 22. In general, the exemplary embodiments of this invention can be beneficially used when constructing transistors that have a hard mask under the top gate, or that do not have a hard mask under the top gate. Further, the exemplary embodiments can be used when fabricating transistors having any number of gates (from one gate, or one fin, to any desired number of gates or fins). Clearly, the exemplary embodiments of this invention apply to multi-gate transistors. In addition, it should be appreciated that the exemplary embodiments of this invention also apply to wire-type transistors, wherein the channel structure 24 passes through the width of the gate structure 22 such that all four surfaces of the channel structure (i.e., top surface, two side surfaces, and the bottom surface) are adjacent to or surrounded by the gate structure and can be electrically influenced by the gate structure. In this embodiment there can be any number of wire-type channel structures passing through the width of the gate structure. As such, the FinFET 20, or more generally the transistor 20, is not to be construed as being limited to or by only the exemplary geometries, materials, dimensions and/or values of resistivity mentioned above.

As such, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention.

What is claimed is:

1. A transistor, comprising:
   a gate structure having a length, a width and a height;
   at least one electrically conductive channel between a source region and a drain region that passes through the width of said gate structure and that is at least partially enclosed and contained within said gate structure, said channel having a first height ($h_1$) within said gate structure that is less than the height of the gate structure, where said channel has a second height ($h_2$) external to said gate structure, where $h_2$ is less than $h_1$; and
   a silicide layer disposed at least partially over said at least one channel external to said gate structure.

2. The transistor of claim 1, where the gate structure comprises a gate dielectric disposed about a gate conductor, and where a portion of said silicide layer at least partially underlies said gate dielectric.

3. The transistor of claim 1, where the gate structure comprises a gate dielectric disposed about a gate conductor, and where a portion of said channel of height $h_2$ that at least partially underlies said gate dielectric is un-silicided.

4. The transistor of claim 1, where a transition between $h_2$ and $h_1$ is an abrupt transition.

5. The transistor of claim 1, where $h_2$ is about one half of $h_1$.

6. The transistor of claim 1, where a transition between $h_2$ and $h_1$ is a gradual transition resulting in a rounded boundary profile in said channel between $h_2$ and $h_1$.

7. The transistor of claim 6, where the gate structure comprises a gate dielectric disposed about a gate conductor, and where a portion of said channel having the rounded boundary profile at least partially underlies said gate dielectric.

8. The transistor of claim 7, where at some of the portion of said channel having the rounded boundary profile that at least partially underlies said gate dielectric is un-silicided.

* * * * *